United States Patent [19]

Roderick et al.

[11] Patent Number: 5,009,306
[45] Date of Patent: Apr. 23, 1991

[54] PRINTED CIRCUIT BOARD CONVEYOR AND METHOD

[75] Inventors: Zackary A. Roderick, Santa Cruz; Leon A. Rode, Merced, both of Calif.

[73] Assignee: Simplimatic Engineering Company, Lynchburg, Va.

[21] Appl. No.: 367,758

[22] Filed: Jun. 19, 1989

[51] Int. Cl.⁵ .............................................. B65G 29/00
[52] U.S. Cl. ................................... 198/414; 198/817; 198/841
[58] Field of Search ...................... 198/817, 841, 861.1, 198/414, 409, 465.3, 837, 861.6

[56] References Cited

U.S. PATENT DOCUMENTS

| | | | |
|---|---|---|---|
| 1,123,999 | 1/1915 | Dupuy | 198/817 |
| 1,476,936 | 12/1923 | Walden | 198/817 |
| 1,645,005 | 10/1927 | Hothersall | 198/817 X |
| 1,781,750 | 11/1930 | Dodge et al. | 198/817 |
| 2,662,633 | 12/1953 | Kingsley | 198/389 |
| 3,002,618 | 10/1961 | Derderian et al. | 209/620 |
| 3,283,882 | 11/1966 | Conrad | 198/817 |
| 3,507,380 | 4/1970 | Sarovich et al. | 198/500 |
| 3,604,554 | 9/1971 | Martz | 198/634 |
| 3,800,938 | 4/1974 | Stone | 198/841 |
| 4,390,091 | 6/1983 | Gonzalez | 198/358 |
| 4,457,419 | 7/1984 | Ogami et al. | 198/817 X |
| 4,591,044 | 5/1986 | Ogami et al. | 198/817 X |
| 4,727,980 | 3/1988 | Ochi et al. | 198/817 X |
| 4,844,231 | 7/1989 | Usui | 198/465.3 X |

FOREIGN PATENT DOCUMENTS

| | | | |
|---|---|---|---|
| 256926 | 2/1988 | European Pat. Off. | 198/465.3 |
| 2205153 | 8/1973 | Fed. Rep. of Germany | 198/414 |
| 211208 | 9/1987 | Japan | 198/465.3 |
| 8705538 | 9/1987 | PCT Int'l Appl. | 198/817 |
| 2067494 | 7/1981 | United Kingdom | 198/817 |

*Primary Examiner*—Robert P. Olszewski
*Assistant Examiner*—Cheryl L. Gastineau
*Attorney, Agent, or Firm*—St. Onge, Steward, Johnston & Reens

[57] ABSTRACT

This invention relates to a conveyor having endless ropes for frictionally transporting articles. The conveyor comprises at least one linear conveyor and a transfer mechanism. Each linear conveyor includes endless conveying ropes and at least two conveyor supports. Each conveyor support preferably includes an elongated substantially vertical body, at least one substantially horizontal platform depending therefrom, and a channel in an uppermost platform to slidably support the endless conveying rope. The transfer mechanism comprises a turntable, a third linear conveyor for receiving an article, a sensor for sensing when an article has been received from a first linear conveyor onto the turntable, a lifter for lifting the turntable, and a rotator for rotating the turntable. The lifter is also for lowering the turntable to a second linear conveyor, and the third linear conveyor is also for delivering the article to the second linear conveyor. Preferably, the delivering and receiving conveyor comprises endless conveying ropes, and at least two conveyor supports.

57 Claims, 6 Drawing Sheets

PRINTED CIRCUIT BOARD CONVEYOR AND METHOD

FIELD OF THE INVENTION

This invention relates to conveyors, and more specifically to conveyors having endless ropes which frictionally transport articles.

BACKGROUND ART

Numerous prior art conveyors incorporate endless ropes which frictionally transport articles. The following endless rope conveyor patents, offered by way of example, incorporate a variety of different features and designs.

U.S. Pat. No. 1,476,936 to Walden discloses an endless cable or rope conveyor. The cables are prevented from sagging by grooved members, and guide rails are disposed outwardly, from above, and parallel to the cables.

U.S. Pat. No. 3,283,882 to Conrad discloses an accumulating conveyor having endless ropes travelling in a U-shaped guide or channel the depth of which is somewhat less than the diameter of the ropes. The ropes are made of plastic material such as polyethylene.

U.S. Pat. No. 3,507,380 to Sarovich et al. teaches the use of lubricant-impregnated wood, such as "Arguto," channels to guide a continuous cable.

SUMMARY OF THE INVENTION

This invention relates to a conveyor having endless ropes for frictionally transporting articles. The conveyor comprises at least one linear conveying means and a transfer mechanism.

Each linear conveying means includes at least two conveyor supports having both a conveying track and a returning track, and at least one sheave rotatably mounted at each end of every conveyor support to route the endless ropes from one conveyor support track to the other. The endless rope is preferably made of polyurethane and is preferably between about 0.08 and 0.10 inches in diameter. Guide rails preferably secure the endless ropes within the conveying tracks and limit contact with the articles to within 0.100 inches of their edge. Preferably also, a separate stepping motor circulates each endless rope individually around through the conveying and returning tracks by rotating at least one sheave.

Each conveyor support preferably includes an elongated substantially vertical body, at least two substantially horizontal platforms depending therefrom, a concavely shaped channel formed in a top surface of the uppermost platform, and a concavely shaped passage formed in a top surface of the second platform.

The channel is preferably less than semicircular shaped and sized to match the endless ropes diameter. The passage is preferably greater than semicircular shaped and sized to match the endless ropes diameter. The conveyor supports are each preferably integral extrusions.

The transfer mechanism comprises a turntable, means for receiving an article, means for sensing when an article has been received from a first linear conveyor onto the turntable, means for lifting the turntable, means for rotating the turntable, means for lowering the turntable to a second linear conveyor, and means for delivering the article to the second linear conveyor. The transfer mechanism also preferably comprises means for stopping other articles on the first linear conveyor until the article is transferred to the second linear conveyor. Preferably, the delivering and receiving means comprise at least two endless ropes, at least two conveyor supports, at least one sheave rotatably mounted at each end of every conveyor support, and a separate stepping motor to circulate each individual endless rope. Preferably also, each conveyor support includes all the features described above.

It is an object of this invention to provide a conveyor which transports articles by contacting them only within about 0.100 inches of their edge. It is another object of this invention to provide an endless rope conveyor which shields the returning portion of the endless rope to protect it from potential damage. It is still another object of this invention to provide a conveyor for transporting a printed circuit board from a first workstation to a second workstation. It is yet another object of this invention to provide a conveyor having a transfer mechanism for receiving articles from a first linear conveyor and for transferring them to a second linear conveyor. It is a further object of this invention to provide an endless rope conveyor which shields the conveying portion of the endless rope to protect it from potential change. These and other objects of the invention will become more apparent from the following detailed description when considered with reference to the accompanying drawings.

DETAILED DESCRIPTION

Figure 1:
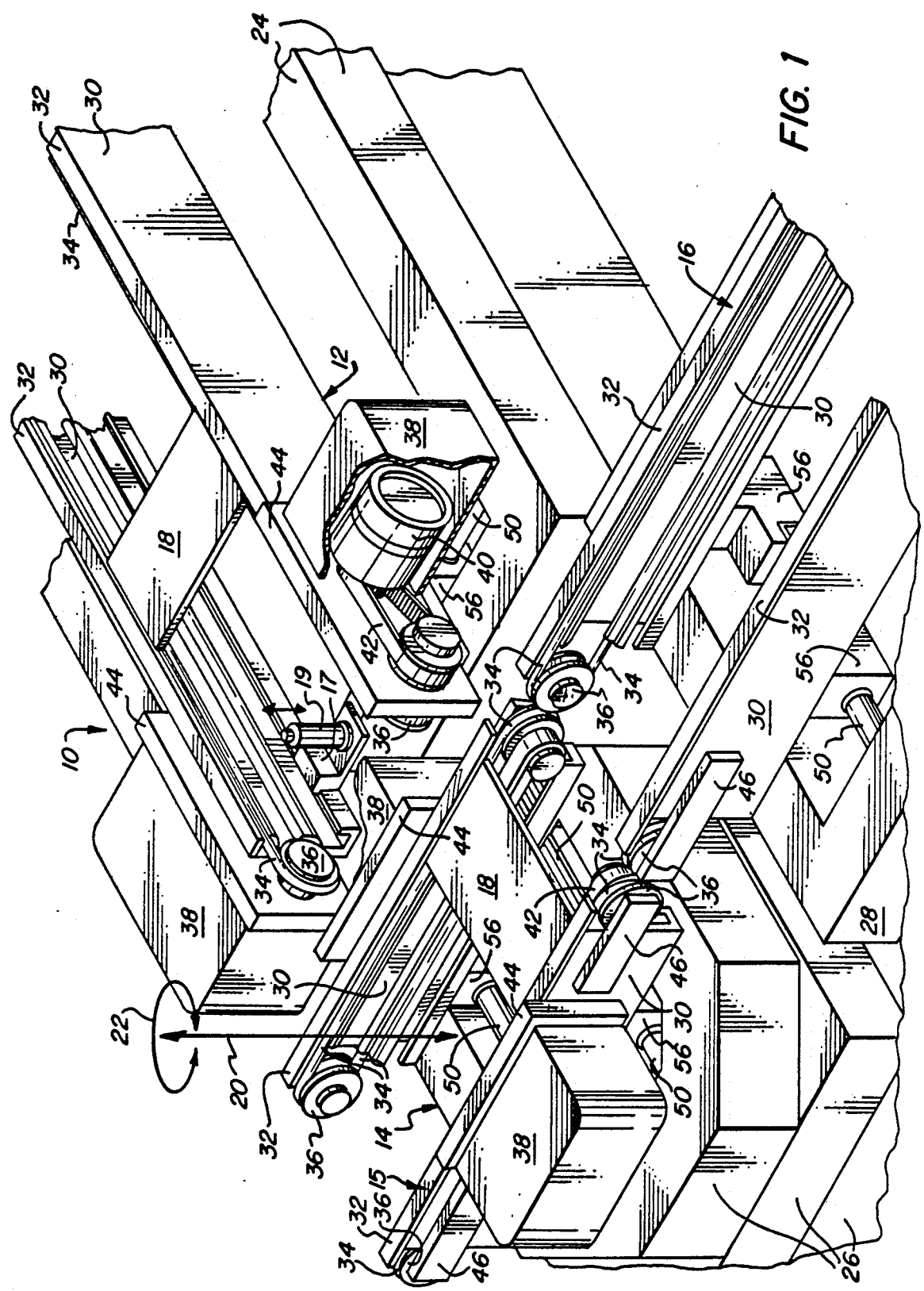
FIG. 1 is a perspective partially cutaway view of a conveyor in accordance with this invention.

Referring to FIG. 1, a conveyor 10 in accordance with this invention is generally shown in a perspective partially cutaway view. As shown, conveyor 10 generally includes a linear conveying portion 12, a transfer mechanism portion 14 including a transfer mechanism conveyor 15, another linear conveying portion 16, and two articles 18. Transfer mechanism portion 14 is adapted to move up and down, and to rotate 360°, as respectively indicated at 20 and 22. The related design features of transfer mechanism portion 14 will be discussed below with reference to FIG. 5. Any single linear conveying portion can function either alone or with one or more transfer mechanism portions. For example, a transfer mechanism portion at the end of a linear conveying portion could be used to spin an article around 180° and return it to the linear conveying portion. Also, any number of linear conveying portions can function either end to end or with transfer mechanism portions therebetween. Conveyor 10 is thus a modular system which is illustrated, but not limited, by the arrangement shown.

Generally, illustrated conveyor 10 will function in the following manner. Transfer mechanism portion 14 will be positioned to receive an article 18 from linear conveying portion 12. An article 18 will be conveyed or transported from linear conveying portion 12 to transfer mechanism portion 14. A sensor (not shown) on transfer mechanism portion 14 (see FIGS. 4 and 5) will sense when article 18 has been completely received. At this time, transfer mechanism conveyor 15 will be halted and a stop mechanism 19 mounted by a hanging bracket 17 to linear conveying portion 12 will be vertically activated via line 21 to prevent additional articles 18 from being conveyed toward transfer mechanism portion 14. Once article 18 has been received, transfer mechanism portion 14 lifts, rotates, and then lowers into alignment with linear conveying portion 16. As transfer mechanism portion 14 lowers, article 18 will begin to be conveyed therefrom toward linear conveying portion 16.

Each individual portion of conveyor 10 includes a base or table. Linear conveying portion 12 has a base 24, transfer mechanism portion 14 has a base 26, and linear conveying portion 16 has a base 28. Mounted on bases 24, 26 and 28, are like components of every portion of conveyor 10 including conveyor supports 30, guide rails 32, endless ropes 34, rope sheaves 36, motor enclosures 38, stepping motors 40, and drive belts 42. Motor enclosures 38 and stepping motors 40 are mounted to conveyor supports 30 with plates 44 sandwiched therebetween for reinforcement. Similarly, rope sheaves 36 are mounted to the ends of conveyor supports 30 with plates 46 for extending them beyond the ends thereof.

For the sake of simplicity, only one stepping motor 40 is shown within motor enclosures 38, but a separate motor exists in each and is used for every conveyor support 30. All of the individual motors for any portion of conveyor 10 are held in phase electrically. Stepping motors may be provided, for example, as AIRPAX® P/N M82801-P1. Although no motors are shown mounted to linear conveying portion 16 in this figure, they are mounted one each on the opposite ends of conveyor supports 30 as illustrated on linear conveying portion 12.

Endless ropes 34 may be provided as twisted, braided, monofilaments, or any combination thereof, but are preferably monofilaments. Further, the ropes may be spliced, braided, heat bonded, glued, molded, or otherwise formed to the desired endless length. Material for the ropes may include steel, rubber, nylon, polyethylene, polypropylene, and preferably polyurethane. One of the advantages of polyurethane monofilament is that its low friction and high resistance to wear substantially reduce the need for lubrication. Finally, when conveying articles such as printed circuit boards or other electrically susceptible apparatus, the ropes may include between about 3% and about 8% of carbon by weight to drain away any static charge which may otherwise build up in the article and damage it.

Figure 2:
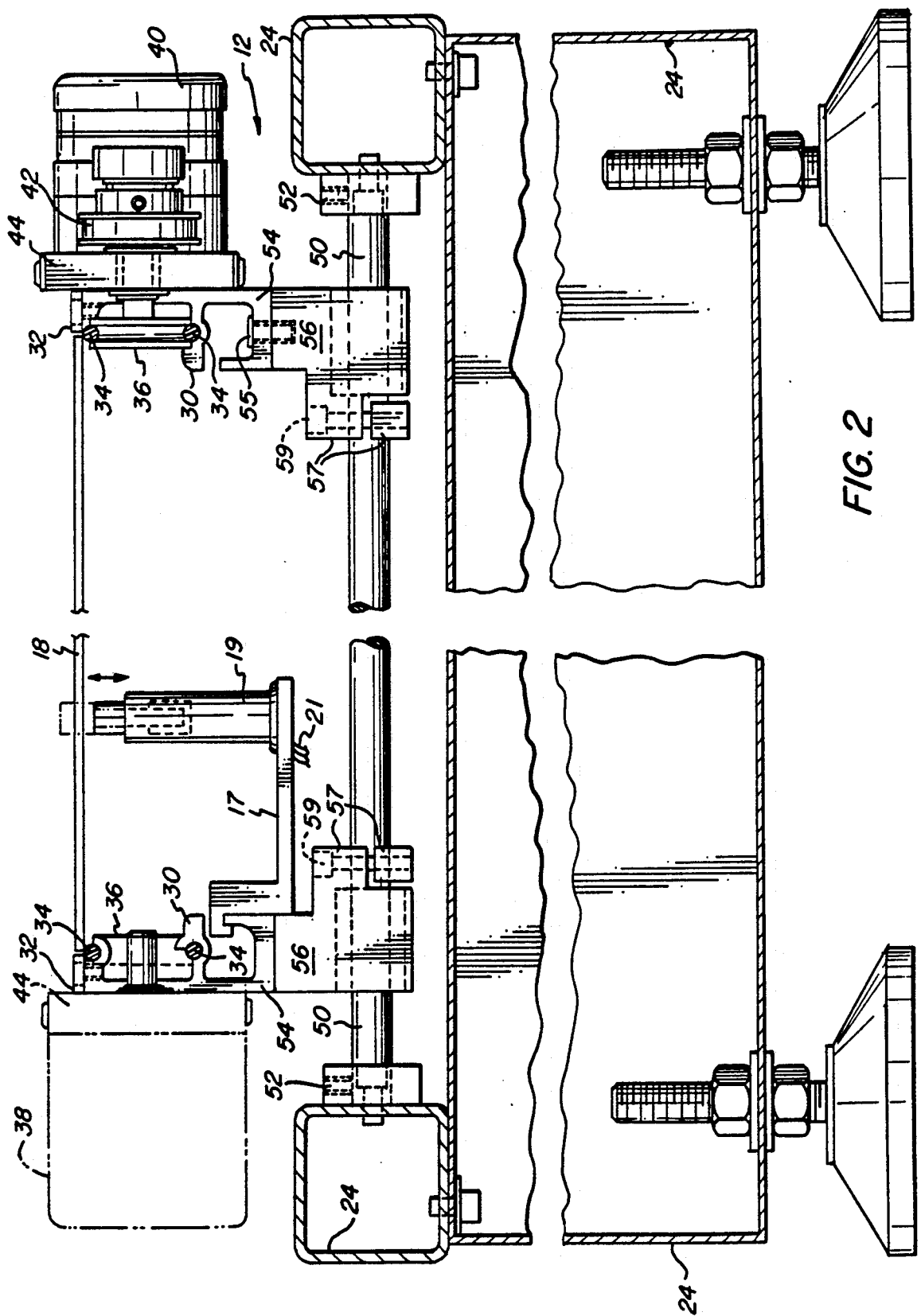
FIG. 2 is an end partial cross-sectional view of a linear conveying portion of the conveyor of FIG. 1.

Referring now to FIG. 2, an end partial cross-sectional view of linear conveying portion 12 reveals additional detail of this and all portions of conveyor 10. Specifically, the method of mounting conveyor supports 30 to base 24 is shown, illustrating how all conveyor supports are mounted to their respective bases. A mounting bar 50 is secured at both ends to base 24 with fittings 52. At least two mounting bars are necessary to support every pair of conveyor supports. A bottom portion 54 of conveyor supports 30 is attached with fasteners 55 to brackets 56 which adjustably clamp along mounting bar 50. In this regard, brackets 56 include set collars 57 having fasteners 59 for drawing brackets 56 tight around mounting bar 50. Conveyor supports 30 thus are adjustable not only to various width articles 18, but also to either side or the middle of base 24 as needed.

Figure 3:
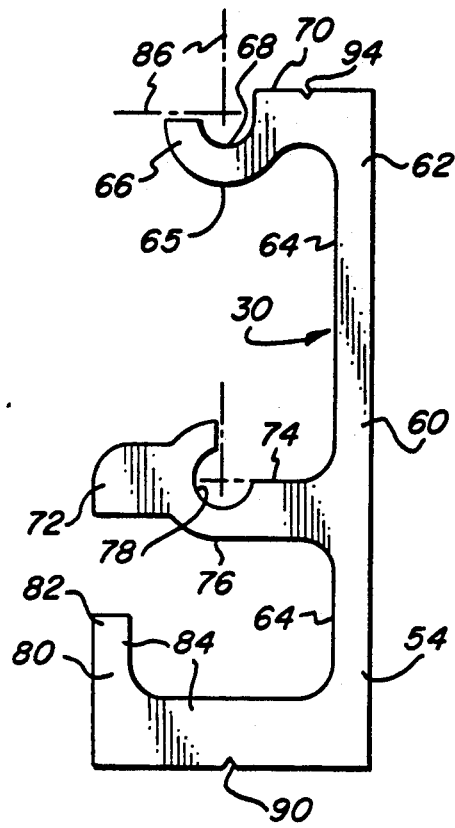
FIG. 3 is an end view of a conveyor support, two of which are shown in every portion of the conveyor of FIG. 1.

FIG. 3 is an enlarged end view of conveyor support 30. Conveyor support 30 may be formed from fiberglass, plastic, or metal. Preferably, conveyor support 30 is metal and most preferably black anodized aluminum. Preferably, conveyor support 30 is extruded, but it may be molded, machined or otherwise formed. Conveyor support 30 includes a substantially vertical body 60 having a top portion 62 and bottom portion 54. Three platforms depend substantially horizontally from substantially vertical body 60.

A first platform 66 having a top surface 70 and a bottom surface 65 depends from side 64 of body 60 at its top portion. Platform 66 includes a concavely shaped channel 68 formed in its top surface 70. Channel 68 slidably supports endless rope 34 from below, forming a conveying track for endless rope 34 to frictionally transport articles.

A second platform 72 having a top surface 74 and a bottom surface 76 depends again from side 64 of body 60 beneath first platform 66. Platform 72 includes a concavely shaped passage 78 bounded by top surface 74 which is formed upward toward bottom surface 65 of first platform 66 and around toward body 60. Passage 78 slidably supports the returning rope from below, forming a returning track for endless rope 34.

A third platform 80 having an end 82 depends again from side 64 of body 60 at its bottom portion 54 beneath second platform 72. Platform 80 is turned up at its end 82 toward bottom surface 76 of second platform 72 to form a raceway 84 for mounting accessories such as sensors, stop mechanisms, and the like. (See FIGS. 1, 2, 4 and 5.)

Preferably, channel 68 is less than semicircular shaped as indicated at 86 by center lines of channel 68. Preferably also, passage 78 is greater than semicircular shaped as indicated at 88 by center lines of passage 78. The greater than semicircular shape serves to shield or protect the returning endless rope from potential damage.

Figure 4:
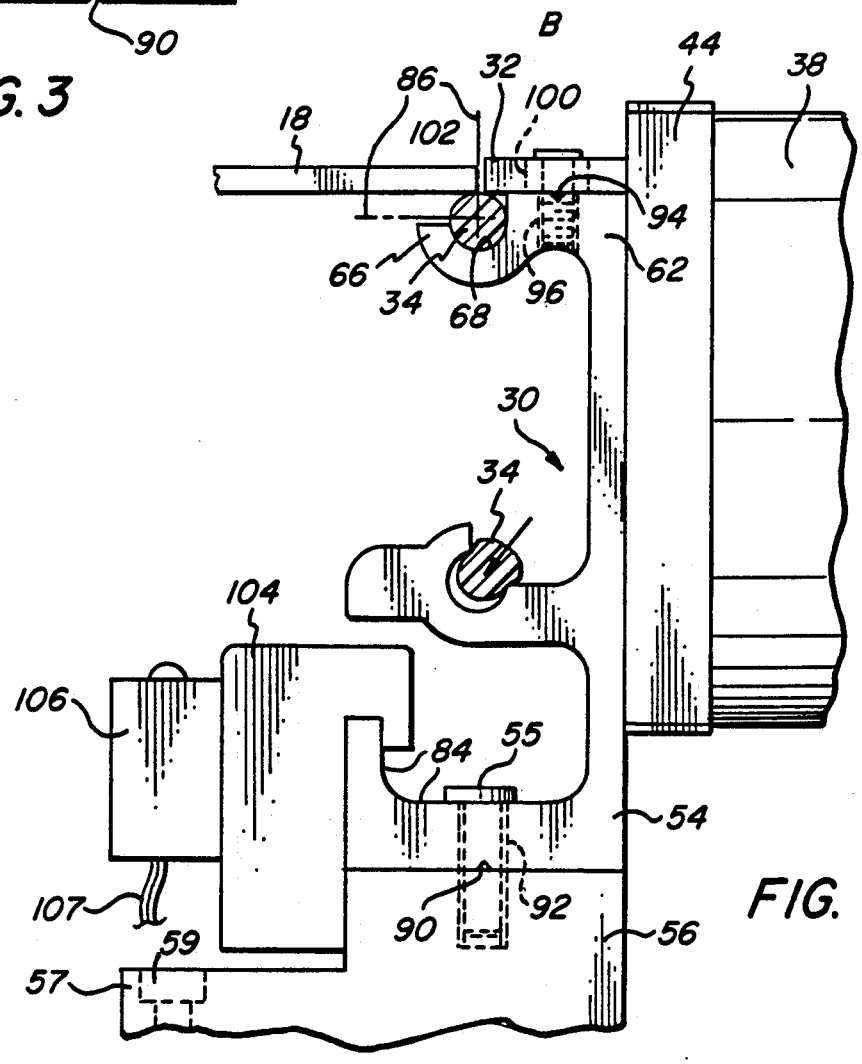
FIG. 4 is an end view of the conveyor support of FIG. 3 shown as mounted to every portion of the conveyor of FIG. 1.

Referring now to FIG. 4, conveyor support 30 as depicted in FIG. 3 is shown as mounted to every portion of conveyor 10. V-shaped groove 90 in bottom portion 54 of conveyor support 30 serves as a locator for hole 92 in third platform 80. Hole 92 may be used in conjunction with fastener 55 to attach conveyor support 30 to bracket 56. In turn, bracket 56 adjustably clamps to mounting bar 50 as shown in FIGS. 1 and 2. Similarly, V-shaped groove 94 in top portion 62 of conveyor support 30 serves as a locator for hole 96 in first platform 66. Hole 96 may be used in conjunction with fastener 98 to mount guide rail 32 to top portion 62 of conveyor support 30. Further, fastener 98 fits through a slot 100 in guide rail 32, which permits guide rail 32 to be horizontally adjusted.

Initially, outer edge 102 of guide rail 32 should extend to slightly less than the vertical center line 86 of channel 68. Preferably, the diameter of endless rope 34 is sized to match the diameter of channel 68, so that center lines 86 of channel 68 are also center lines of endless rope 34.

Preferably, channel 68 is less than semicircular shaped as indicated by horizontal center line 86. Preferably, the diameter of endless rope 34 is between about 0.08 inches and about 0.10 inches. Guide rail 32, then, serves to retain endless rope 34 within channel 68, and to shield more than one-half the surface of endless rope 34 to protect it from potential damage. Preferably, guide rail 32 is chrome plated to reduce friction with endless rope 34.

Further, guide rail 32 serves the additional function of retaining articles 18 on the endless conveying ropes while limiting contact with the articles to within 0.100 inches of their edge. This type of conveying system is particularly useful for articles which may be contaminated if contacted in a more substantial manner by the conveying belt. In this regard, article 18 may include a tray, pallet, or other object which must be transported by contact limited to within 0.001 inches of its edge such as a printed circuit board.

Raceway 84 is shown including a sensor 106 mounted hanging bracket 104. Sensor 106 senses when article 18 moves into a position directly above it and relays a signal via line 107. Hanging bracket 104 is similar to hanging bracket 17, but is designed for locating a mechanism along raceway 84 which operate from near an edge of the conveying portion.

Figure 5:
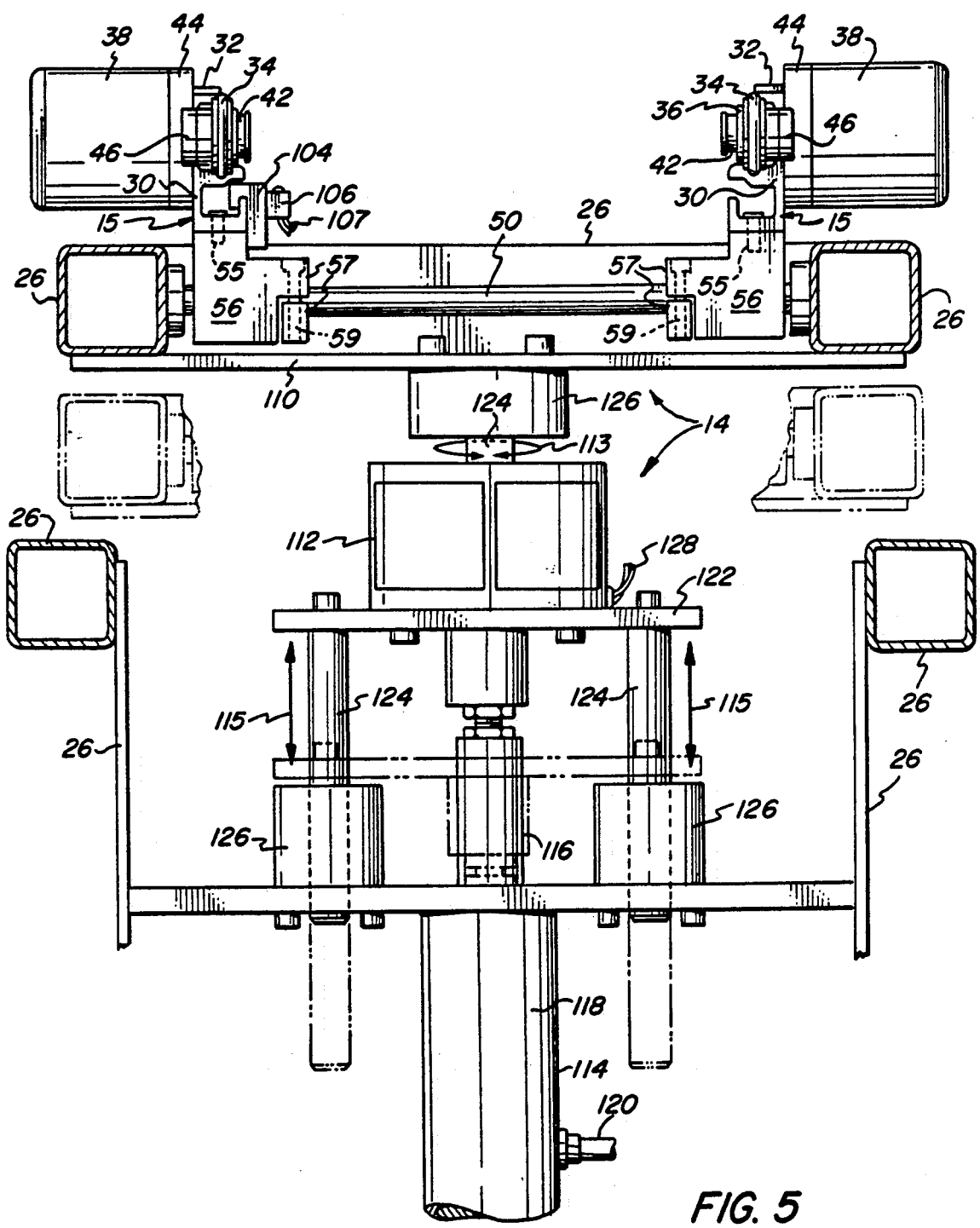
FIG. 5 is an end partial cross-sectional view of a transfer mechanism portion of the conveyor of FIG. 1.

Referring now to FIG. 5, an end partial cross-sectional view of transfer mechanism portion 14 of conveyor 10 reveals additional detail. Transfer mechanism portion 14 includes a turntable 110 upon which transfer mechanism conveyor 15 is mounted, a rod and cylinder assembly 114 for lifting and lowering turntable 110 as indicated at 115, and a motor 112 for rotating turntable 110 through 360° as indicated at 113.

Transfer mechanism conveyor 15 is mounted on turntable 110 in the same way every conveyor support 30 is mounted to every portion of conveyor 10. Conveyor supports 30 are mounted with fasteners 55 to brackets 56. Brackets 56 are clamped along mounting bar 50 with set collars 57 having fasteners 59. Mounting bar 50 then is secured to base 26 on turntable 110.

Rod and cylinder assembly 114 includes rod 116 and cylinder 118. Rod 116 is actuated via line 120 to lift and lower lift platform 122. During lifting and lowering, lift platform 122 is guided by bars 124 which slide in yokes 126.

Motor 112 is mounted atop lift platform 122 Motor 112 includes a shaft 124 which is mounted to turntable 110 with turntable mount 126. Motor 112 is actuated via line 128 to rotate turntable 110 and bring conveyor supports 30 of transfer mechanism portion 14 into alignment with the linear conveying portions serviced thereby.

Because each conveyor support is horizontally adjustable along every mounting bar of every linear conveying portion, the conveyor supports of every transfer mechanism portion must be horizontally adjustable to match the conveyor supports of any linear conveying portion(s) serviced thereby. Further, anytime a transfer mechanism services more than one linear conveying portion, the conveyor supports of all conveyor portions must be mutually aligned to permit the transfer of articles between any two linear conveying portions.

The horizontal adjustability of the conveyor supports of the linear conveying portions of conveyor 10 necessitates that the turntable of the transfer mechanism portion lift before rotating. The turntable lifts to prevent fouling between the conveyor supports of the transfer mechanism portion and the conveyor supports of linear conveying portions during rotation.

Because the turntable lifts prior to rotating, conveyor supports of the transfer mechanism portion may be closer to the conveyor supports of serviced linear conveying portions permitting smaller articles to be conveyed thereby. Further, the closeness of the conveyor supports enhances frictional transport of articles due to the nearly continuous contact of endless conveying ropes to the articles.

Figure 6:
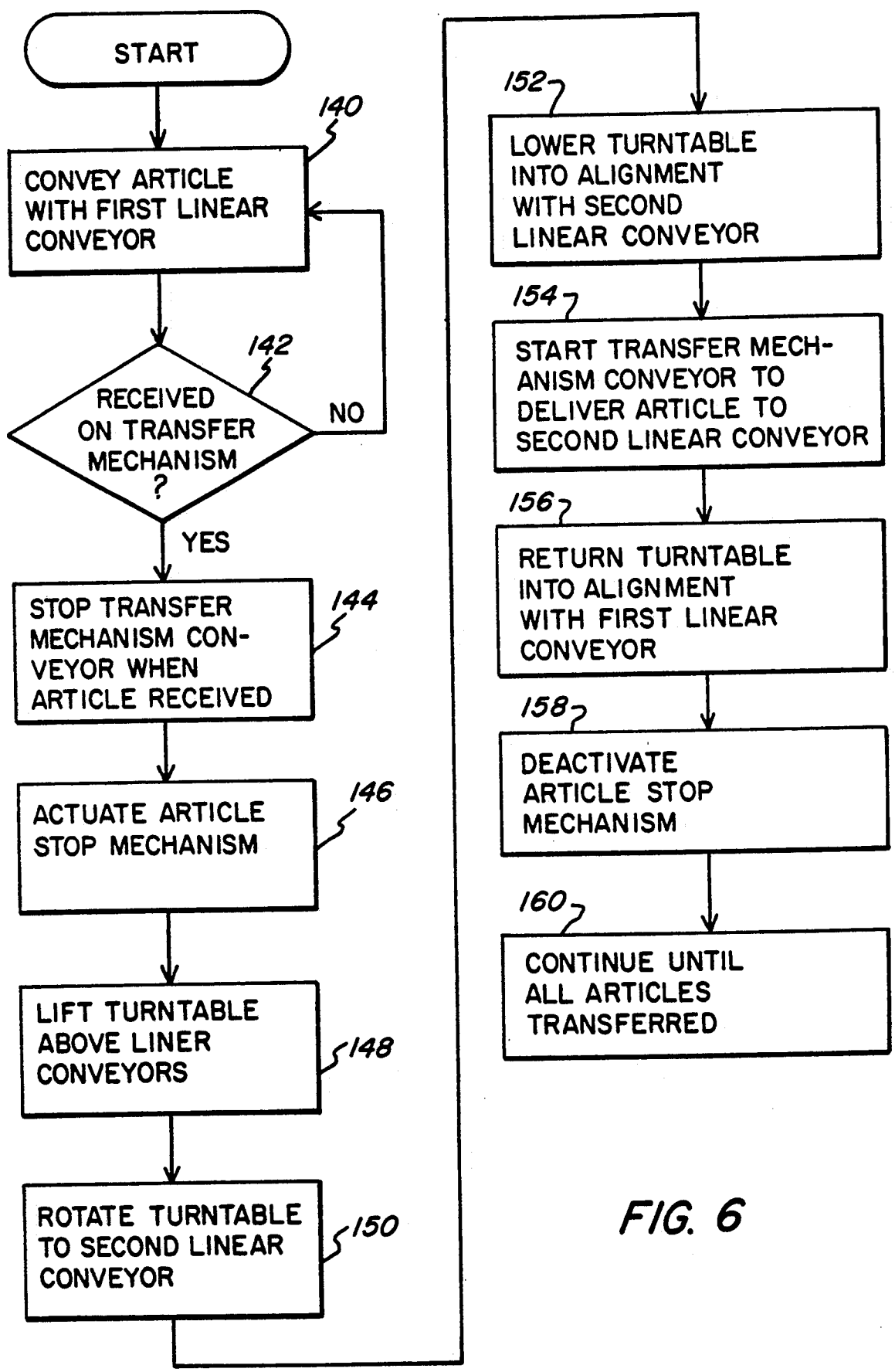
FIG. 6 is a flow diagram illustrating a method of conveying articles in accordance with this invention.

Referring now to FIG. 6, a flow diagram illustrates a method of conveying articles in accordance with this invention. The method described corresponds to conveyor 10 as illustrated in FIG. 1. Articles are conveyed with a first linear conveyor as indicated at box 140 until an article is sensed as received on the transfer mechanism as indicated at box 142. Once an article is received, the transfer mechanism conveyor is stopped as indicated at box 144, and the article stop mechanism is actuated as indicated at box 146. Next, the turntable is lifted, rotated, and lowered into alignment with a second linear conveyor as indicated at boxes 148, 150, and 152. As the turntable lowers, the transfer mechanism conveyor starts to deliver the article to the second linear conveyor as indicated at box 154. Next, the turntable is returned into alignment with the first linear conveyor as indicated at box 156. Once the turntable is returned, the article stop mechanism is deactivated as indicated at box 158. The method continues, as indicated at box 160, until all articles have been transferred.

Figure 7:
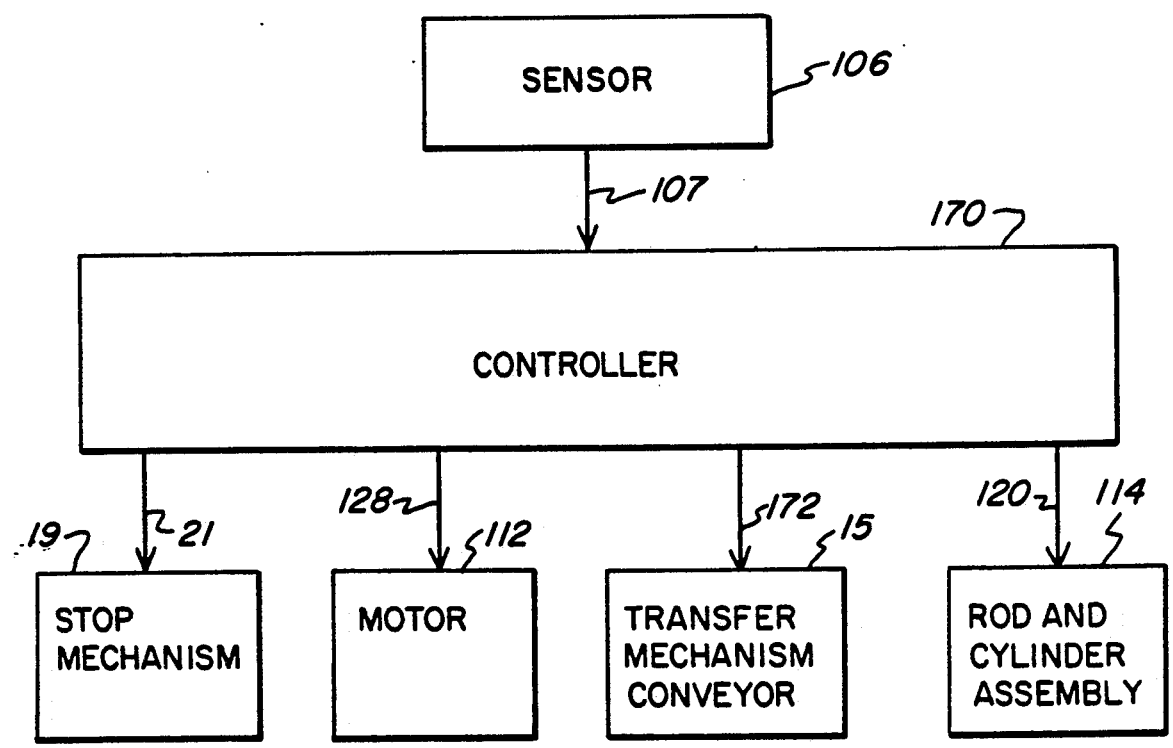
FIG. 7 is a schematic diagram illustrating the control mechanism for the conveyor of FIG. 1.

Referring now to FIG. 7, a schematic diagram illustrates control of conveyor 10. Controller 170 (Not shown in other Figs.) receives input from sensor 106 via line 107 indicating that an article has been received on the transfer mechanism portion. Further, controller 170 actuates and deactivates stop mechanism 19 via line 21, starts and stops motor 112 via line 128, starts and stops transfer mechanism conveyor 15 via line 172 (not shown in other Figs.), and actuates and deactivates rod and cylinder assembly 114 via line 120.

The above description is not meant to describe in detail each and every modification and variation which will be apparent to a person skilled in the art.

What is claimed is:

1. A conveyor support for conveyors having endless ropes which frictionally transport articles, the conveyor support comprising:

an elongated substantially vertical body having a top portion and a bottom portion;

a first platform depending substantially horizontally from a side of the body along its length at its top portion, the first platform having a top surface and a bottom surface;

a concavely shaped channel formed in the top surface of and running the length of the first platform, the channel to slidably support the endless rope from below to frictionally transport articles;

a second platform depending substantially horizontally from a side of the body along its length beneath the first platform, the second platform having a top surface and a bottom surface; and a concavely shaped passage running the length of the second platform and bounded by the top surface of the second platform which is formed upward toward the bottom surface of the first platform and around toward the body to slidably support the returning rope from below.

2. The conveyor support of claim 1 wherein the concavely shaped channel of the first platform comprises a less than semicircular shaped channel.

3. The conveyor support of claim 1 wherein the concavely shaped channel of the first platform is sized to match the diameter of the endless rope.

4. The conveyor support of claim 1 wherein the concavely shaped passage of the second platform is greater than semicircular shaped, and envelops more than half the surface of the endless rope to protect it from potential damage.

5. The conveyor support of claim 4 wherein the greater than semicircular shaped passage is sized to match the diameter of the rope and surrounds the endless rope such that the diameter of the rope must be pinched down to snap the rope into the passage.

6. The conveyor support of claim 1 wherein the endless rope is polyurethane.

7. The conveyor support of claim 6 wherein the endless rope contains about 3 to about 8 percent carbon by weight to drain any electrical charge away from the transported articles.

8. The conveyor support of claim 1 wherein the endless rope has a diameter of between about 0.08 inches and about 0.10 inches.

9. The conveyor support of claim 1 including a third platform depending substantially horizontally from a side of the body along its length at its bottom portion, the third platform being turned up at its end toward the bottom surface of the second platform to form a raceway for mounting accessories along the length of the conveyor support.

10. The conveyor support of claim 1 including a guide rail horizontally adjustably mounted to the top portion of the body above the first platform to secure the endless rope in the concavely shaped channel.

11. The conveyor support of claim 10 wherein the guide rail and the concavely shaped channel of the first platform combine to shield more than half the surface of the endless rope to protect it from potential damage.

12. The conveyor support of claim 10 wherein the guide rail has a chrome surface to reduce friction with the endless rope.

13. The conveyor support of claims 1, 3, 4 or 9 wherein the conveyor support is an integral extrusion.

14. A conveyor having endless ropes for frictionally transporting articles comprising:
    at least two substantially parallel, substantially continuous conveyor supports, each having a conveying track for slidably supporting a conveying portion of the endless rope from below and a returning track for slidably supporting a returning portion of the endless rope from below;
    sheaves having circumferential grooves, each sheave rotatably mounted to the ends of each conveyor support such that the sheaves' grooves are aligned with both the conveying track and the return track of the conveyor support, the sheaves' grooves for routing the endless ropes from one conveyor support track to another conveyor support track;
    guide rails horizontally adjustably mounted to the conveyor supports above the conveying tracks to secure the endless ropes in the conveying tracks and to limit contact with the articles to within about 0.001 inches of their edge while frictionally transporting them; and
    at least two stepping motors kept in phase, each attached to a single conveyor support and positioned to rotate at least one sheave on each conveyor support to circulate the endless rope around through the conveying and returning tracks, and to permit the conveyor supports to be horizontally adjustable.

15. The conveyor of claim 14 wherein the conveyor supports comprise:
    an elongated substantially vertical body having a top portion and a bottom portion;
    a first platform depending substantially horizontally from a side of the body along its length at its top portion, the first platform having a top surface and a bottom surface;
    the conveying track comprising a concavely shaped channel formed in the top surface of and running the length of the first platform, the channel to slidably support the endless rope from below to frictionally transport articles; and
    a second platform depending substantially horizontally from a side of the body along its length beneath the first platform, the second platform having a top surface and a bottom surface;
    the conveying track comprising a concavely shaped passage running the length of the second platform and bounded by the top surface of the second platform which is formed upward toward the bottom surface of the first platform and around toward the body to slidably support the returning rope from below.

16. The conveyor of claim 15 wherein the concavely shaped channel of the first platform comprises a less than semicircular shaped channel.

17. The conveyor of claim 15 wherein the concavely shaped channel of the first platform is sized to match the diameter of the endless rope.

18. The conveyor of claim 15 wherein the concavely shaped passage of the second platform is greater than semicircular shaped, and envelops more than half the surface of the endless rope to protect it from potential damage.

19. The conveyor of claim 18 wherein the greater than semicircular shaped passage is sized to match the diameter of the endless rope and surrounds the endless rope such that the diameter of the rope must be pinched down to snap the rope into the passage.

20. The conveyor of claim 15 wherein the endless rope is polyurethane.

21. The conveyor of claim 20 wherein the endless rope contains about 3 to about 8 percent carbon by weight to drain any electrical charge away from the transported articles.

22. The conveyor of claim 20 wherein the endless rope contains about 5 percent carbon by weight to drain any electrical charge away from the transported articles.

23. The conveyor of claim 15 including a third platform depending substantially horizontally from a side of the body along its length at its bottom portion, the third platform being turned up at its end toward the bottom surface of the second platform to form a raceway for mounting accessories along the length of the conveyor support.

24. The conveyor of claim 14 wherein the guide rails and the conveyor supports combine to shield more than half the surface of the endless rope to protect it from potential damage.

25. The conveyor support of claim 14 wherein the guide rails have a chrome surface to reduce friction with the endless rope.

26. A conveyor comprising:
at least one means for linearly conveying articles, the linear conveying means including at least two endless ropes and at least tow conveyor supports, each conveyor support comprising
an elongated substantially vertical body having a top portion and a bottom portion,
a first platform depending substantially horizontally from a side of the body along its length at its top portion, the first platform having a top surface and a bottom surface,
a concavely shaped channel formed in the top surface of and running the length of the first platform, the channel to slidably support the endless rope to frictionally transport articles, and
a concavely shaped passage running the length of the body beneath the first platform, the passage to slidably support the returning rope; and
a transfer mechanism to receive articles from a first linear conveying means and to deliver them to a workstation, the transfer mechanism comprising
means for receiving an article from the first linear conveying means,
means for lifting the received article above the first linear conveying means,
means for rotating the lifted article to the workstation,
means for lowering the rotated article to the workstation, and
means for delivering the article from the transfer mechanism to the workstation.

27. The conveyor of claim 26 wherein the concavely shaped channel of the first platform comprises a less than semicircular shaped channel.

28. The conveyor of claim 26 wherein the concavely shaped channel of the first platform is sized to match the diameter of the endless rope.

29. The conveyor support of claim 26 wherein the concavely shaped passage is greater than semicircular shaped, and envelops more than half the surface of the endless rope to protect it from potential damage.

30. The conveyor support of claim 26 wherein the concavely shaped passage is formed in a second platform which depends substantially horizontally from a side of the body beneath the first platform.

31. The conveyor support of claim 26 wherein the workstation is a second linear conveying means.

32. The conveyor support of claim 31 wherein the endless rope contains 5 percent carbon by weight to drain any electrical charge away from the transported articles.

33. The conveyor support of claim 26 wherein the endless rope has a diameter of between about 0.08 inches and about 0.10 inches.

34. The conveyor support of claim 26 wherein said concavely shaped passage is formed in a second platform depending substantially horizontally from a side of the body along its length beneath the first platform, and further including a third platform depending substantially horizontally from a side of the body along its length at its bottom portion, the third platform forming a raceway for mounting accessories along the length of the conveyor support.

35. The conveyor support of claim 26 including a guide rail horizontally adjustably mounted to the top portion of the body above the first platform to secure the endless rope in the concavely shaped channel.

36. The conveyor support of claim 35 wherein the guide rail and the concavely shaped channel of the first platform combine to shield more than half the surface of the endless rope to protect it from potential damage.

37. The conveyor support of claim 35 wherein the guide rail has a chrome surface to reduce friction with the endless rope.

38. The method of conveying articles from a first workstation to a second workstation comprising:
conveying articles with a first endless rope conveying means from the first workstation to a transfer mechanism;
receiving an article from the first endless rope conveying means onto the transfer mechanism;
once an article has been received, stopping additional articles from being conveyed onto the transfer mechanism;
lifting the article clear of the first endless rope conveying means with the transfer mechanism;
rotating the article, with the transfer mechanism, to present the article to the second endless rope conveying means;
lowering the transfer mechanism into alignment with the second endless rope conveying means;
conveying the article off the transfer mechanism and onto the second endless rope conveying means; and
conveying the article with the second endless rope conveying means from the transfer mechanism to the second workstation wherein the first and second conveying means both include endless ropes and conveyor supports, each conveyor support comprising
an elongated substantially vertical body having a top portion and a bottom portion,
a first platform depending substantially horizontally from a side of the body along its length at its top portion, the first platform having a top surface and a bottom surface,
a concavely shaped channel formed in the top surface of and running the length of the first platform, the channel to slidably support a conveying portion of the endless rope to frictionally transport articles, and
a concavely shaped passage formed in and running the length of the body at a position beneath the first platform, the passage to slidably support a returning portion of the endless rope.

39. The method of claim 38 including returning the transfer mechanism to its original position to receive another article until all articles have been conveyed to the second workstation.

40. A transfer mechanism for receiving articles from a first linear conveyor means and delivering them to a second linear conveyor means, the transfer mechanism comprising:
a turntable;
third means, mounted to the turntable, for linearly conveying an article from the first linear conveyor means onto the turntable;
means for lifting the turntable and article clear of the first linear conveyor means;
means for rotation the turntable and article to bring the third linear conveyor means and articles into partial alignment with the second linear conveyor means; and means for lowering the turntable and the articles into alignment with the second linear conveyor means;

the third linear conveyor means for conveying the articles from the turntable onto the second linear conveyor means, and wherein the three linear conveying means comprise means for linearly conveying articles by limiting contact with the articles to within 0.001 inches of their edge.

41. The transfer mechanism of claim 40 wherein the three linear conveyor means each include endless ropes nd conveyor supports, each conveyor support comprising:

an elongated substantially vertical body having a top portion and a bottom portion;

a first platform depending substantially horizontally from a side of the body along its length at its top portion, the first platform having a top surface and a bottom surface;

a concavely shaped channel formed in the top surface of and running the length of the first platform, the channel to slidably support the endless rope to frictionally transport articles; and a concavely shaped passage running the length of the body beneath the first platform, the passage to slidably support the returning rope.

42. The transfer mechanism of claim 41 wherein the concavely shaped channel of the first platform comprises a less than semicircular shaped channel.

43. The transfer mechanism of claim 41 wherein the concavely shaped channel of the first platform is sized to match the diameter of the endless rope.

44. The transfer mechanism of claim 41 wherein the concavely shaped passage is greater than semicircular shaped, and envelops more than half the surface of the endless rope to protect it from potential damage.

45. The transfer mechanism of claim 41 wherein the concavely shaped passage is formed in a second platform which depends substantially horizontally from a side of the body beneath the first platform.

46. The conveyor support of claim 41 wherein the endless rope is polyurethane.

47. The conveyor support of claim 41 wherein the endless rope contains 5 percent carbon by weight to drain any electrical charge away from the transported articles.

48. The conveyor support of claim 41 wherein the endless rope has a diameter of between about 0.08 inches and about 0.10 inches.

49. The conveyor support of claim 41 including another platform depending substantially horizontally from a side of the body along its length at its bottom portion, the other platform forming a raceway for mounting accessories along the length of the conveyor support.

50. The conveyor support of claim 41 including a guide rail horizontally adjustably mounted to the top portion of the body above the first platform to secure the endless rope in the concavely shaped channel.

51. The conveyor support of claim 50 wherein the guide rail and the concavely shaped channel of the first platform combine to shield more than half the surface of the endless rope to protect it from potential damage.

52. The conveyor support of claim 50 wherein the guide rail has a chrome surface to reduce friction with the endless rope.

53. A conveyor support for conveyors having endless ropes which frictionally transport articles, the conveyor support comprising:

an elongated substantially vertical body having a top portion and a bottom portion;

a first platform depending substantially horizontally from a side of the body along its length at its top portion, the first platform having a top surface and a bottom surface;

a concavely shaped channel formed in the top surface of and running the length of the first platform, the channel to slidably support the endless rope to frictionally transport articles; and a concavely shaped passage running the length of the body beneath the first platform, the passage to slidably support the returning rope, the passage greater than semicircular shaped to envelop more than half the surface of the endless rope and protect it from potential damage.

54. The conveyor support of claim 53 wherein the concavely shaped channel of the first platform comprises a less than semicircular shaped channel.

55. The conveyor support of claim 53 wherein the concavely shaped channel of the first platform is sized to match the diameter of the endless rope.

56. A conveyor having endless ropes for frictionally transporting articles comprising:

at least two substantially parallel, substantially continuous conveyor supports, each having a conveying track for slidably supporting a conveying portion of the endless rope and a returning track for slidably supporting a returning portion of the endless rope;

sheaves having circumferential grooves, each sheave rotatably mounted to the ends of each conveyor support such that the sheaves' grooves are aligned with both the conveying track and the return track of the conveyor support, the sheaves' grooves for routing the endless ropes from one conveyor support track to another conveyor support track;

guide rails horizontally adjustably mounted to the conveyor supports above the conveying tracks to secure the endless ropes in the conveying tracks and to limit contact with the articles to their edge while frictionally transportation them; and means for rotating at least on sheave on each conveyor support to circulate the endless rope around through the conveying and returning tracks.

57. The conveyor of claim 56 wherein the conveyor supports comprise:

an elongated substantially vertical body having a top portion and a bottom portion;

a first platform depending substantially horizontally from a side of the body along its length at its top portion, the first platform having a top surface and a bottom surface;

the conveying track comprising a concavely shaped channel formed in the top surface of and running the length of the first platform; and the returning track comprising a concavely shaped passage running the length of the conveyor support beneath the first platform.

* * * * *